(12) United States Patent
Eum et al.

(10) Patent No.: US 10,530,259 B2
(45) Date of Patent: *Jan. 7, 2020

(54) LED DRIVING DEVICE

(71) Applicant: SEMICONDUCTOR COMPONENTS INDUSTRIES, LLC, Phoenix, AZ (US)

(72) Inventors: Hyun-Chul Eum, Bucheon (KR); Doo-Yong Jung, Bucheon (KR); Young-Jong Kim, Seoul (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/994,113

(22) Filed: May 31, 2018

(65) Prior Publication Data

US 2018/0278165 A1 Sep. 27, 2018

Related U.S. Application Data

(63) Continuation of application No. 15/604,133, filed on May 24, 2017, now Pat. No. 10,004,121.

(60) Provisional application No. 62/344,780, filed on Jun. 2, 2016.

(51) Int. Cl.
*H05B 33/08* (2006.01)
*H02M 3/335* (2006.01)
(Continued)

(52) U.S. Cl.
CPC ......... *H02M 3/33507* (2013.01); *H02M 1/08* (2013.01); *H02M 1/32* (2013.01);
(Continued)

(58) Field of Classification Search
CPC .............. H05B 33/0815; H05B 33/083; H05B 33/0824; H05B 33/0851; H05B 33/0848;
(Continued)

(56) References Cited

U.S. PATENT DOCUMENTS 7,081,722 B1   7/2006 Huynh et al.
7,496,155 B1   2/2009 Lu et al.
(Continued)

OTHER PUBLICATIONS

Texas Instruments Incorporated, "TPS92410 Switch-Controlled, Direct Drive, Linear Controller for Offline LED Drivers," May 2014.

*Primary Examiner* — Vibol Tan
(74) *Attorney, Agent, or Firm* — AMPACC Law Group, PLLC

(57) ABSTRACT

An LED driving device includes an LED string including at least first and second LED elements connected in series, first and second channels coupled to output nodes of the first and second LED elements, respectively, first and second regulators to regulate a current flowing through the first and second channels in response to first and second control voltages, respectively, and a control voltage generating circuit to generate the first and second control voltages based on a difference between a reference voltage and a comparative voltage, the comparative voltage being generated based on a sensing voltage, the sensing voltage corresponding to an LED current flowing through the LED string. The control voltage generating circuit includes a reference voltage generator to generate the reference voltage based on an input voltage and the dimming signal, the input voltage being supplied to the LED string, the dimming signal controlling dimming of the LED string.

20 Claims, 7 Drawing Sheets

(51) Int. Cl.
  *H02M 1/08* (2006.01)
  *H03G 1/00* (2006.01)
  *H02M 1/32* (2007.01)
  *H02M 1/00* (2006.01)
(52) U.S. Cl.
  CPC ...... *H02M 3/33515* (2013.01); *H03G 1/0088* (2013.01); *H05B 33/083* (2013.01); *H05B 33/0812* (2013.01); *H05B 33/0815* (2013.01); *H05B 33/0824* (2013.01); *H05B 33/0842* (2013.01); *H05B 33/0845* (2013.01); *H05B 33/0851* (2013.01); *H05B 33/0887* (2013.01); *H02M 2001/0009* (2013.01)
(58) Field of Classification Search
  CPC .............. H05B 33/0845; H05B 33/089; H05B 33/0812; H05B 37/02; H05B 33/0806; H05B 33/0857; H05B 33/086; H05B 33/0884; H05B 33/0821; H05B 33/0842
  See application file for complete search history.

(56) References Cited

U.S. PATENT DOCUMENTS

| | | | |
|---|---|---|---|
| 7,986,107 B2 | 7/2011 | Weaver et al. | |
| 8,055,641 B2 | 11/2011 | Shiah | |
| 8,164,276 B2 | 4/2012 | Kuwabara | |
| 8,174,212 B2 | 5/2012 | Tziony et al. | |
| 8,207,685 B2 | 6/2012 | Cheng et al. | |
| 8,410,717 B2* | 4/2013 | Shteynberg | H05B 33/0812 315/185 R |
| 8,680,782 B2* | 3/2014 | Sakuragi | H05B 33/083 315/185 S |
| 8,896,227 B2* | 11/2014 | Moskowitz | H05B 33/0809 315/209 R |
| 9,155,147 B2 | 10/2015 | Kim et al. | |
| 9,426,856 B2 | 8/2016 | Shteynberg | |
| 9,510,415 B1* | 11/2016 | Wang | H05B 33/083 |
| 10,314,122 B1* | 6/2019 | Cheng | H05B 33/0812 |
| 2012/0217887 A1* | 8/2012 | Kang | H05B 33/0809 315/193 |
| 2013/0162144 A1* | 6/2013 | Lee | H05B 37/02 315/122 |
| 2014/0312771 A1 | 10/2014 | Lee et al. | |
| 2014/0361696 A1 | 12/2014 | Siessegger et al. | |
| 2015/0271884 A1* | 9/2015 | Kim | H05B 33/0824 315/153 |
| 2015/0312984 A1* | 10/2015 | Kim | H05B 33/083 315/186 |
| 2015/0327341 A1* | 11/2015 | Kim | H05B 33/083 315/224 |
| 2015/0334802 A1 | 11/2015 | Ryu | |
| 2016/0007418 A1 | 1/2016 | Kim et al. | |

\* cited by examiner

LED DRIVING DEVICE

CROSS-REFERENCE TO RELATED APPLICATION

This application is a continuation of U.S. patent application Ser. No. 15/604,133, filed on May 24, 2017, entitled "LED DRIVING DEVICE," which claims the benefit of U.S. Provisional Application No. 62/344,780 filed on Jun. 2, 2016, which are incorporated by reference herein in their entirety.

BACKGROUND

This present disclosure relates to a light emitter device (LED) driving device. Specifically, embodiments relate to an LED driving device, which receives a rectified AC input supplied to an LED string.

An LED string includes a plurality of LED elements, and may be directly connected to an AC line. A sinusoidal wave rectified from an AC input is supplied to the AC line, and the sinusoidal wave may control the number of LED elements to be turned on in the LED string.

In such an LED driving device described above, Inverse Compton (IC) scattering may occur due to resistance differences among a plurality of resistors connected to pins that control a degree of illumination of a plurality of LED elements, input offsets of amplifiers in the LED driving device, and so on. A trimming process is required to reduce the IC scattering of the LED driving device, and the trimming process may increase production costs.

In addition, when a waveform of a current flowing through the LED string has a step-like profile, a power factor (PF) and total harmonic distortion (THD) may be deteriorated.

DETAILED DESCRIPTION

Figure 1:
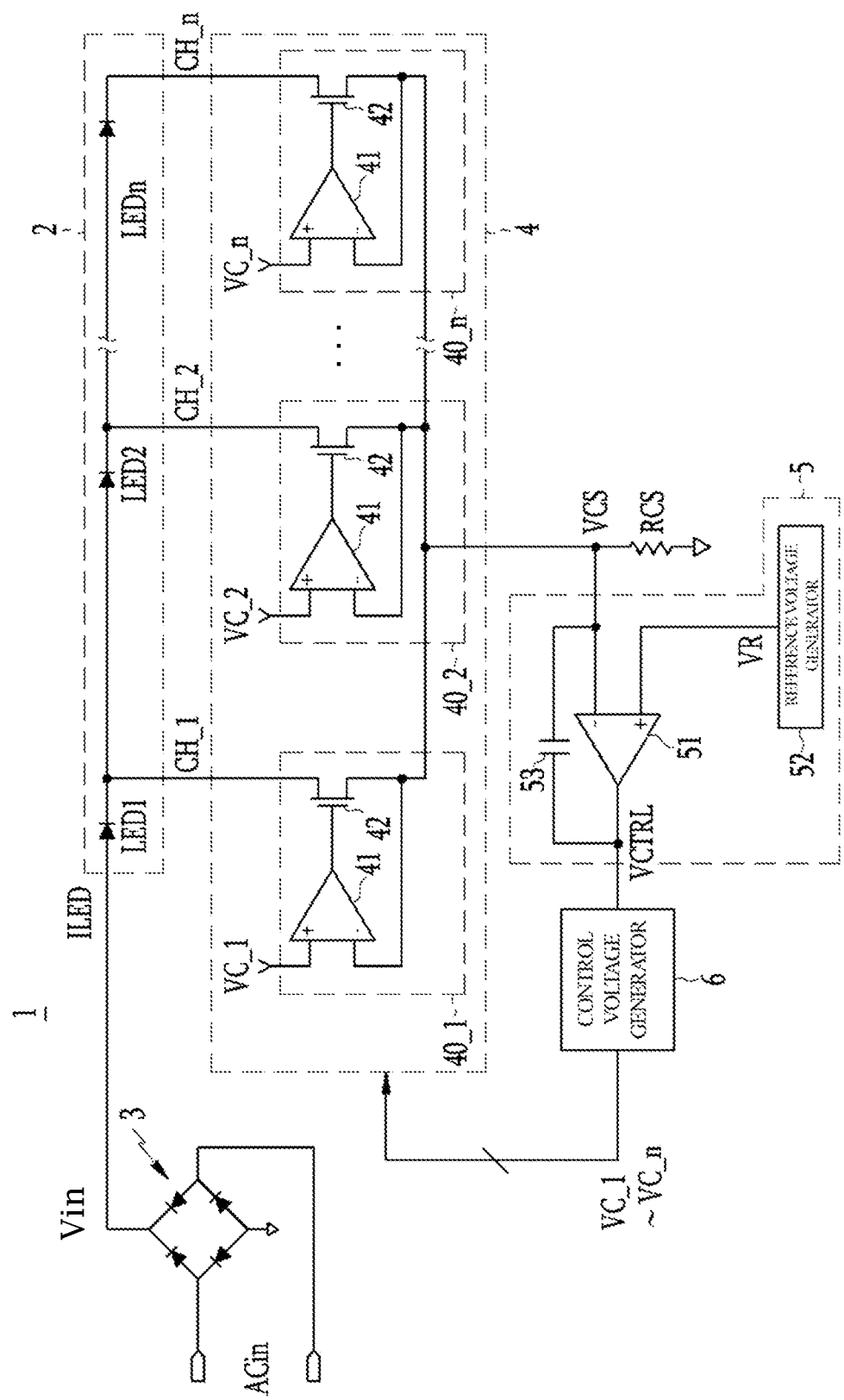
FIG. 1 illustrates an LED driving device according to an embodiment.

In the following detailed description, certain illustrative embodiments have been illustrated and described. As those skilled in the art would realize, these embodiments may be modified in various different ways without departing from the scope of the present disclosure. Accordingly, the drawings and description are to be regarded as illustrative in nature and not restrictive. Similar reference numerals designate similar elements in the specification.

FIG. 1 illustrates an LED driving device 1 according to an embodiment. The LED driving device 1 of FIG. 1 includes an LED string 2, a rectification circuit 3 that supplies an input voltage Vin of a sinusoidal waveform to the LED string 2, a current regulator 4, a control signal generator 5, and a control voltage generator 6.

The LED string 2 of FIG. 1 includes one or more of LED elements LED1-LEDn, which are connected in series with one another. An AC input ACin is rectified by the rectification circuit 3 into a sinusoidal wave, and an input voltage Vin is generated according to the rectified AC input, i.e., the sinusoidal wave. The input voltage Vin is provided to the LED string 2. FIG. 1 illustrates the LED string 2 as including the plurality of LED elements. However, embodiments are not limited thereto. In another embodiment, the LED string 2 may be configured with only one LED element.

The current regulator 4 of FIG. 1 includes a plurality of regulators $40\_1$-$40\_n$, and controls a current flowing through each of a plurality of channels CH_1-CH_n. Each of the plurality of channels CH_1-CH_n is positioned between a corresponding LED element of the plurality of LED elements LED1-LEDn and a corresponding regulator of the plurality of regulators $40\_1$-$40\_n$.

One sensing resistor RCS is connected to the current regulator 4. The current flowing through each of the plurality of channels CH_1-CH_n is controlled according to a sensing voltage VCS. A current flowing through one of the plurality of channels CH_1-CH_n may flow to the sensing resistor RCS. Accordingly, a current flowing through the sensing resistor RCS corresponds to the current flowing through the one channel.

The current regulator 4 of FIG. 1 includes the plurality of regulators $40\_1$-$40\_n$ connected to the plurality of channels CH_1-CH_n, respectively. One of the plurality of regulators $40\_1$-$40\_n$ may be enabled according to the input voltage Vin, which has the sinusoidal waveform. The enabled one of the plurality of regulators $40\_1$-$40\_n$ may control a current flowing through a channel connected to the enabled one of the plurality of regulators $40\_1$-$40\_n$. In an embodiment, the plurality of regulators $40\_1$-$40\_n$ may control different amounts of currents flowing through the plurality of regulators $40\_1$-$40\_n$.

Each of the plurality of regulators $40\_1$-$40\_n$ of FIG. 1 includes a transistor 42 connected to a corresponding channel of the plurality of channels CH_1-CH_n, and an amplifier 41 to control the transistor 42. A drain of each transistor 42 is connected to the corresponding channel, and a source of each transistor 42 is connected to one end of the sensing resistor RCS. An output terminal of each amplifier 41 is connected to a gate of the corresponding transistor 42, an inverting input terminal (−) of each amplifier 41 is connected to the source of the corresponding transistor 42, and a non-inverting input terminal (+) of each amplifier 41 receives a corresponding control voltage among a plurality of control voltages VC_1-VC_n.

Each amplifier 41 of FIG. 1 generates an output based on a difference between a corresponding control voltage inputted to the corresponding non-inverting input terminal (+) and the sensing voltage VCS inputted to the corresponding inverting input terminal (−). Each transistor 42 of FIG. 1 controls a current of the corresponding channel in response to the output of the corresponding amplifier 41.

Each of the plurality of regulators 40_1-40_n of FIG. 1 controls the sensing voltage VCS with a corresponding control voltage VC, and controls a current of a corresponding channel with a current corresponding to the control voltage VC. Each of the plurality of control voltages VC_1-VC_n is a voltage that determines a current flowing through a corresponding channel, and may be set as a voltage whose level increases from the control voltage VC_1 to the control voltage VC_n.

Specifically, after the input voltage Vin starts increasing, the first LED device LED1 of FIG. 1 may be turned on first, such that a current flows through the first channel CH_1 connected to the first LED device LED1. The first regulator 40_1 of FIG. 1 controls the current flowing through the first channel CH_1 with the first control voltage VC_1. The first regulator 40_1 controls the current flowing through the first channel CH_1, so that the sensing voltage VCS changes depending on the first control voltage VC_1.

Subsequently, according to the increasing input voltage Vin, the second LED device LED2 of FIG. 1 may be turned on, such that a current flows through the second channel CH_2. The current flowing through the second channel CH_2 is controlled by the second regulator 40_2 of FIG. 1 with the second control voltage VC_2. At this time, the sensing voltage VCS increases by the current flowing through the second channel CH_2. As a result, when the sensing voltage VCS becomes higher than the first control voltage VC_1, the first regulator 40_1 of FIG. 1 is disabled.

When the input voltage Vin increases to a certain level, the (n)th LED device LEDn of FIG. 1 may be turned on, such that a current flows through the (n)th channel CH_n. The current flowing through the (n)th channel CH_n is controlled by the (n)th regulator 40_n of FIG. 1 with the (n)th control voltage VC_n. At this time, the sensing voltage VCS increases by the current flowing through the (n)th channel CH_n. When the sensing voltage VCS becomes higher than the (n−1)th control voltage VC_n−1 of the (n−1)th regulator 40_n−1 of FIG. 1 connected to the (n−1)th channel CH_n−1 preceding the (n)th channel CH_n, the (n−1)th regulator 40_n−1 is disabled.

When the input voltage Vin reaches a peak level and then decreases to the certain level, the (n)th LED device LEDn may be turned off, such that the current does not flow through the (n)th channel CH_n, and the (n)th regulator 40_n of FIG. 1 is disabled. Accordingly, the (n−1)th regulator 40_n−1 of FIG. 1 is enabled and the current flows through the (n−1)th channel CH_n−1.

According to the decreasing input voltage Vin, the LED devices of FIG. 1 may be turned off in the order of the (n−1)th LED device, the (n−2)th LED device, . . . , the second LED device LED2, and the first LED device LED1.

As a result, the regulators of FIG. 1 are enabled in the order of the (n−2)th regulator 40_n−2, the (n−3)th regulator 40_n−3, . . . , the second regulator 40_2, and the first regulator 40_1. A current ILED of the LED string 2 of FIG. 1 flows through the respective channels in the order of the (n−2)th channel CH_n−2, the (n−3)th channel CH_n−3, . . . , the second channel CH_2, and the first channel CH_1.

The plurality of regulators 40_1-40_n of the current regulator 4 of FIG. 1 shares the sensing resistor RCS, and the plurality of control voltages VC_1-VC_n are set to have different levels. Therefore, regulators, among the plurality of regulators 40_1-40_n, are enabled in accordance with a change in a level of the input voltage Vin, and a target value of the corresponding channel current is changed in accordance with the change in the level of the input voltage Vin.

The control signal generator 5 of FIG. 1 generates a control signal VCTRL to regulate the sensing voltage VCS with a reference voltage VR. The control signal VCTRL is a signal that controls brightness of the LED string 2 of FIG. 1.

The control signal generator 5 of FIG. 1 includes an amplifier 51 and a reference voltage generator 52. The sensing voltage VCS is inputted to an inverting input terminal (−) of the amplifier 51, and the reference voltage VR is inputted to a non-inverting input terminal (+) of the amplifier 51. A compensation capacitor 53 may be connected between the inverting input terminal (−) and an output terminal of the amplifier 51. A bandwidth of the amplifier 51 may be adjusted according to a capacitance of the compensation capacitor 53.

The reference voltage generator 52 of FIG. 1 may generate the reference voltage VR based on at least one of a DC voltage, the input voltage Vin, a dimming signal DIM to control dimming of the LED string 2, and a feedback voltage.

The control voltage generator 6 of FIG. 1 generates the plurality of control voltages VC_1-VC_n based on the control signal VCTRL. In an embodiment, the control voltage generator 6 may include a plurality of resistors connected in series, and generate the plurality of control voltages VC_1-VC_n by dividing a level of the control signal VCTRL using the plurality of resistors.

In other embodiments, the plurality of control voltages VC_1-VC_n may be determined as follows:

$$VC\_1=VCTRL\times1;\ VC\_2=VCTRL\times2;\ \ldots;\ \text{and}$$
$$VC\_n=VCTRL\times n,\ \text{or}$$

$$VC\_1=VCTRL+1V;\ VC\_2=VCTRL+2V;\ \ldots;\ \text{and}$$
$$VC\_n=VCTRL+nV.$$

As a result, levels of the plurality of control voltages VC_1-VC_n may increase in the order of VC_1 to VC_n, i.e., VC_1<VC_2< . . . <VC_n. The control voltage generator 6 of FIG. 1 may include any circuit capable of implementing any of the above equations.

In an embodiment, the reference voltage generator 52 of FIG. 1 may generate a constant DC voltage as the reference voltage VR. In another embodiment, the reference voltage generator 52 of FIG. 1 may detect the dimming signal DIM and generate the reference voltage VR based on the detected dimming signal DIM.

In an embodiment, the dimming signal DIM may have a constant voltage. In this embodiment, the reference voltage generator 52 of FIG. 1 may set the dimming signal DIM as the reference voltage VR.

In another embodiment, the dimming signal DIM may be determined based on a phase angle of an input voltage Vin.

In this embodiment, the reference voltage generator 52 of FIG. 1 may generate the reference voltage VR by detecting the dimming signal DIM that is determined based on the phase angle.

Figure 2B:
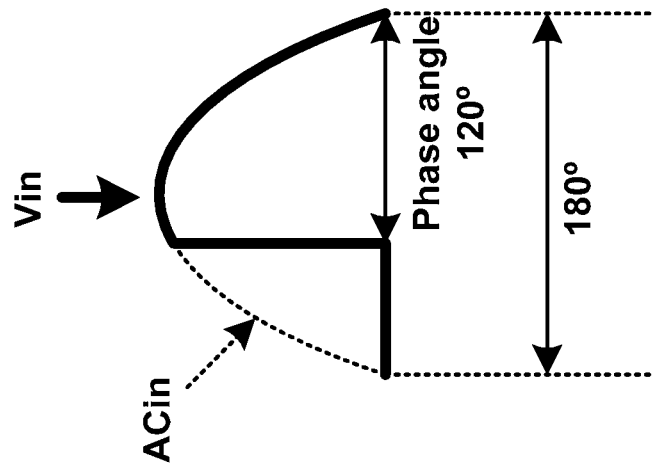
FIG. 2B illustrates an operation of a dimmer of FIG. 2A.
Figure 2A:
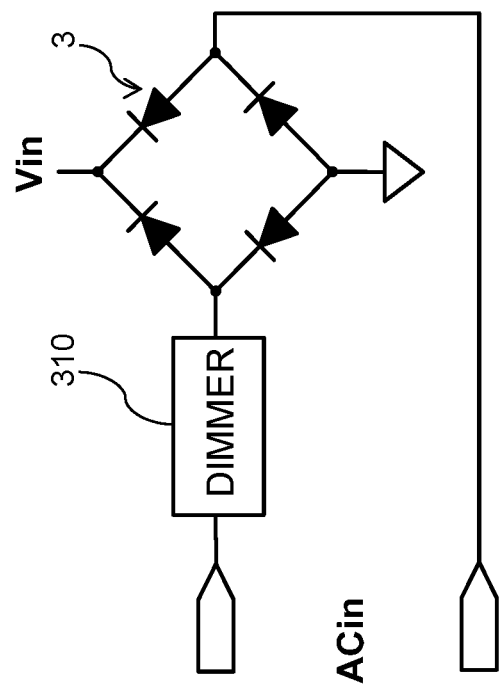
FIG. 2A illustrates a part of an LED driving device according to an embodiment.

Referring to FIG. 2A, a dimmer 310 may be connected between the AC input ACin and the rectification circuit 3 of FIG. 1. The dimmer 310 may pass only a component of the AC input ACin that belongs to a predetermined range of phase, e.g., 120° of 180°, as shown in FIG. 2B. In this embodiment, the predetermined range of phase is referred to as a "phase angle." The phase angle may be adjusted by an external control. The other components of AC input ACin that belong to other phase angles cannot pass the dimmer 310. Because the input voltage Vin is generated by rectifying the AC input ACin that has passed through the dimmer 310, the input voltage Vin has a waveform that corresponds to the phase angle.

A voltage PA, which is approximately proportional to the phase angle of the input voltage Vin and, hereinafter, referred to as a "phase angle voltage," may be obtained from the input voltage Vin in a variety of manners.

Figure 3A:
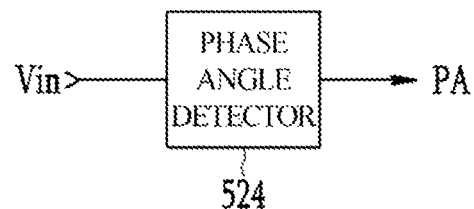
FIGS. 3A to 3C illustrate circuit configurations for generating phase angle information.
Figure 3B:
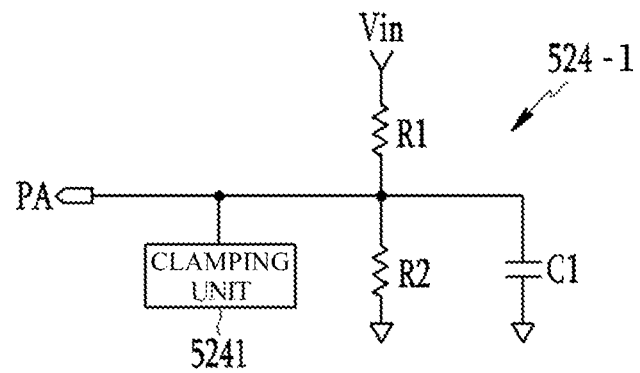
Figure 3C:
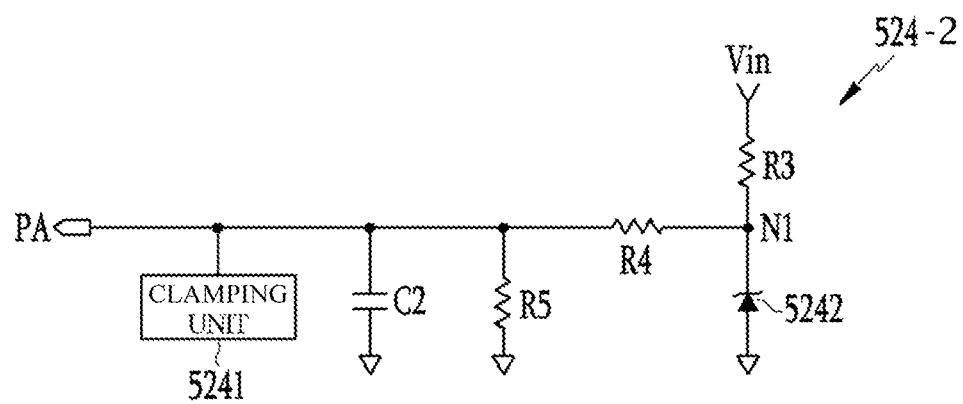

FIGS. 3A to 3C illustrate configurations for generating phase angle information such as a phase angle voltage PA. A phase angle detector 524 of FIG. 3A may filter the input voltage Vin and generate the phase angle voltage PA, which is a DC voltage.

Referring to FIG. 3B, a phase angle detector 524-1 includes two resistors R1 and R2, a capacitor C1, and a clamping unit 5241. The resistor R1 and the resistor R2 of FIG. 3B are connected in series between the input voltage Vin and the ground, and the capacitor C1 is connected between a connection node of the two resistors R1 and R2 and the ground. The phase angle voltage PA is generated when the input voltage Vin passes through a low pass filter configured with the two resistors R1 and R2 and the capacitor C1. The clamping unit 5241 of FIG. 3B may clamp at least one of a maximum level and a minimum level of the phase angle voltage PA.

Referring to FIG. 3C, a phase angle detector 524-2 may include three resistors R3, R4, and R5, a capacitor C2, a Zener diode 5242, and a clamping unit 5241. The resistor R3 and the Zener diode 5242 of FIG. 3C are connected in series between the input voltage Vin and the ground. A low pass filter, which includes the two resistors R4 and R5 and the capacitor C2 of FIG. 3C, is connected to a node N1, the node N1 being a connection node of the transistor R3 and the Zener diode 5242. A voltage at the node N1 follows the input voltage Vin, and the voltage at the node N1 may be clamped by the Zener diode 5242 as a Zener voltage.

The voltage at the node N1 passes through the low pass filter, such that the phase angle voltage PA is generated.

In an embodiment, the reference voltage generator 52 of FIG. 1 may generate the dimming signal DIM according to the phase angle voltage PA generated in the manner described above, and outputs the dimming signal DIM as the reference voltage VR. In an embodiment, the phase angle voltage PA may be used as the dimming signal DIM.

In another embodiment, the dimming signal DIM may be an analog input or a pulse width modulation (PWM) input for controlling dimming, the dimming signal DIM may be provided by an MCU output or any external voltage signal. In an embodiment, the reference voltage generator 52 of FIG. 1 filters the analog input or the PWM input, generates a DC voltage based on the filtered result, and outputs the DC voltage as the reference voltage VR.

In yet another embodiment, the reference voltage generator 52 of FIG. 1 may generate a feedback voltage FB as the reference voltage VR. The reference voltage generator 52 may generate the feedback voltage FB by amplifying and compensating a difference between the sensing voltage VCS and a feedback reference voltage VR1. In an embodiment, the feedback voltage FB may be a DC voltage.

Figure 4:
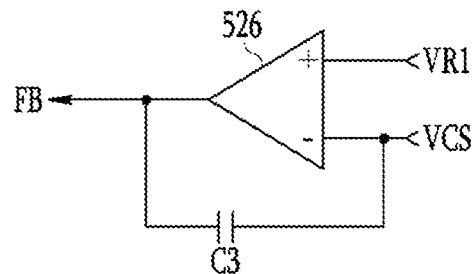
FIG. 4 illustrates a configuration for generating a feedback voltage.

FIG. 4 illustrates a configuration for generating the feedback voltage FB. A feedback amplifier 526 of FIG. 4 includes a non-inverting input terminal (+) that receives a feedback reference voltage VR1 having a constant level, and an inverting input terminal (−) that receives the sensing voltage VCS. A compensation capacitor C3 is connected between the inverting input terminal (−) and an output terminal of the feedback amplifier 526.

The feedback amplifier 526 of FIG. 4 amplifies a difference between the feedback reference voltage VR1 and the sensing voltage VCS. An output of the feedback amplifier 526 is compensated by the compensation capacitor C3, and thus the feedback voltage FB is generated. To this end, the compensation capacitor C3 may be set with a sufficiently large capacitance, so that a reaction speed of the feedback amplifier 526 is slow enough to generate the feedback voltage FB as a DC voltage. The dimming signal DIM may be inputted as the feedback reference voltage VR1.

When the reference voltage VR is a sinusoidal wave, the bandwidth of the amplifier 51 of FIG. 1 may be higher than a line frequency. In this case, the sensing voltage VCS in a half cycle of the line frequency is in an identical planar shape to the reference voltage VR. The line frequency is a frequency of the AC input ACin, and the half cycle of the line frequency is a half cycle of the AC input ACin. The half cycle of the line frequency is identical to one cycle of the input voltage Vin.

Conversely, when the reference voltage VR is a DC voltage, the bandwidth of the amplifier 51 of FIG. 1 may be lower than the line frequency. In this case, an average of the sensing voltage VCS is regulated to the reference voltage VR.

When the bandwidth of the amplifier 51 of FIG. 1 is lower than the line frequency, a loop speed of the amplifier 51 may be slow. The amplifier 51 generates the control signal VCTRL based on a difference between the sensing voltage VCS and the reference voltage VR, and the plurality of control voltages VC_1-VC_n are controlled in accordance with the control signal VCTRL. When the loop speed of the amplifier 51 is slow, a delay occurs in reflecting the difference between the sensing voltage VCS and the reference voltage VR to the control signal VCTRL outputted from the amplifier 51. Accordingly, the average of the sensing voltages VCS follows the reference voltage VR. As a result, the average of the current ILED flowing through the LED string 2 of FIG. 1 may be controlled by the reference voltage VR.

The current regulator 4 of FIG. 1 may be implemented by an IC, and the current ILED may vary depending on IC scattering under the same dimming condition. In an embodiment, a difference between the current ILED by the IC scattering and a target value under a given dimming condition may be compensated by adjusting the reference voltage VR.

For example, the reference voltage VR is increased when the current ILED is lower than the target value. Then, the control voltage VCTRL increases according to the reference voltage VR, and thus a level of each of the plurality of control voltages VC_1-VC_n also increases. As a result, a current flowing through each of the plurality of channels CH_1-CH_n increases, and thus the current ILED also increases. The degree that the reference voltage VR increases may be adjusted according to the difference between the current ILED and the target value.

Conversely, when the current ILED is higher than the target value, the reference voltage VR is decreased. Accordingly, the control voltage VCTRL decreases according to the reference voltage VR, and thus a level of each of the plurality of control voltages VC_1-VC_n decreases. As a result, the current flowing through each of the plurality of channels CH_1-CH_n decreases, and thus the current ILED also decreases. The degree that the reference voltage VR decreases may be adjusted according to the difference between the current ILED and the target value.

As described above, an error in the current ILED due to the IC scattering may be compensated by adjusting the reference voltage VR.

An example in which the reference voltage generator 52 of FIG. 1 generates the reference voltage VR of a DC voltage has been described above, but embodiments are not limited thereto. Although the reference voltage VR is generated as the DC voltage in order to improve the IC scattering, it is also possible that the reference voltage generator 52 generates the reference voltage VR in a waveform that is different from the DC voltage in order to improve a power factor (PF) and total harmonic distortion (THD). For example, the waveform that is different from the DC voltage, such as a sinusoidal wave or the like, may be applied to the reference voltage VR. Hereinafter, the "sinusoidal wave" includes not only a sinusoidal wave, but also a waveform similar to the sinusoidal wave.

In an embodiment, the reference voltage generator 52 of FIG. 1 may detect the input voltage Vin and generate the reference voltage VR based on the detected input voltage Vin. A variety of methods may be implemented to detect the input voltage Vin. Embodiments of the methods will be described with reference to FIGS. 5A to 5C.

Figure 5A:
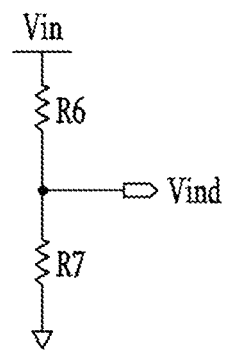
FIGS. 5A to 5C illustrate configurations for detecting an input voltage.
Figure 5B:
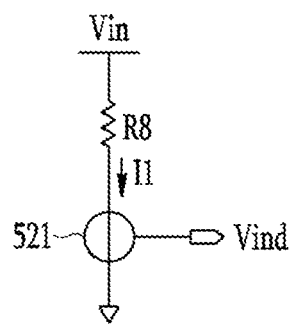
Figure 5C:
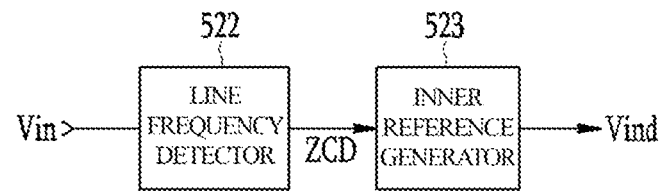

FIGS. 5A to 5C illustrate configurations for detecting the input voltage Vin. As illustrated in FIG. 5A, the reference voltage generator 52 of FIG. 1 may include a circuit that divides the input voltage Vin using two resistors R6 and R7, which are connected in series with each other, and generates an input detection voltage Vind.

As illustrated in FIG. 5B, the reference voltage generator 52 of FIG. 1 may include a circuit that senses a current I1 flowing through a resistor R8 by the input voltage Vin, and generates an input detection voltage Vind based on the current I1.

The circuit of FIG. 5B may further include a current sensor 521 connected between the resistor R8 and the ground, and the current sensor 521 may sense the current I1, such that the input detection voltage Vind may be generated according to the detected current I1.

As illustrated in FIG. 5C, the reference voltage generator 52 of FIG. 1 may include a circuit that detects a point in time when the input voltage Vin reaches 0V, and that generates an input detection voltage Vind synchronized with the input voltage Vin based on the detected point in time.

The circuit of FIG. 5C may include a line frequency detector 522 and an inner reference generator 523. The line frequency detector 522 of FIG. 5C detects the point in time when the input voltage Vin reaches 0V by comparing the input voltage Vin with a zero crossing reference voltage, and generates a zero crossing signal ZCD synchronized with the detected point in time. The inner reference generator 523 of FIG. 5C may be synchronized with the input voltage Vin according to the zero crossing signal ZCD, and may generate the input detection voltage Vind according to the waveform of the input voltage Vin.

As described above, the reference voltage generator 52 of FIG. 1 may generate the input detection voltage Vind in a variety of manners, and outputs the input detection voltage Vind as the reference voltage VR in accordance with some embodiments.

Under a condition where the reference voltage VR is generated according to the input detection voltage Vind, the bandwidth of the amplifier 51 of FIG. 1 may be set to be higher than the line frequency, and thus the loop speed of the amplifier 51 may be relatively fast compared to when the bandwidth of the amplifier 51 is set to be lower than the line frequency. With the fast loop speed of the amplifier 51, the difference between the sensing voltage VCS and the reference voltage VR is reflected in the control signal VCTRL outputted from the amplifier 51, and the sensing voltage VCS follows the reference voltage VR. Accordingly, the waveform of the current ILED flowing through the LED string 2 of FIG. 1 may be controlled with a sinusoidal wave synchronized with the input voltage Vin.

Because the current ILED has a sinusoidal waveform, the PF and THD are improved.

Other embodiments can control the dimming of the LED string 2 of FIG. 1 while improving the PF and THD.

In other embodiments, the reference voltage generator 52 of FIG. 1 may generate the reference voltage VR using the input detection voltage Vind in combination with the dimming signal DIM, or using the input detection voltage Vind in combination with the feedback voltage FB.

For example, the reference voltage generator 52 of FIG. 1 may generate the reference voltage VR by multiplying the input detection voltage Vind by the dimming signal DIM, or by adding the input detection voltage Vind to the dimming signal DIM. These embodiments will be described with reference to FIGS. 6A and 6B.

Figure 6A:
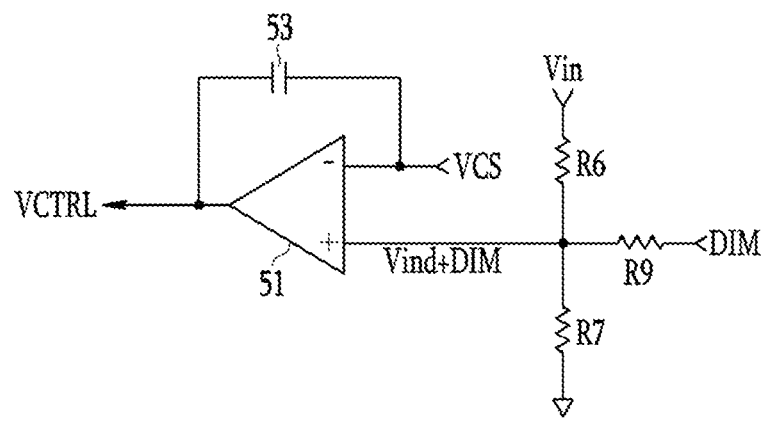
FIG. 6A illustrates a control signal generator using a reference voltage that is generated by adding a dimming signal to an input detection voltage, according to an embodiment.

FIG. 6A illustrates a control signal generator using a reference voltage VR that is generated by adding a dimming signal DIM to an input detection voltage Vind according to an embodiment.

Referring to FIG. 6A, a voltage Vind+DIM, i.e., a sum of the input detection voltage Vind and the dimming signal DIM, is generated as the reference voltage VR, the input detection voltage Vind is divided from the input voltage Vin by two resistors R6 and R7, and the dimming signal DIM is delivered through a resistor R9.

FIG. 6A illustrates a configuration for generating the input detection voltage Vind using the configuration illustrated in FIG. 5A, embodiments are not limited thereto. Accordingly, a configuration for generating the input detection voltage Vind may be implemented with the configuration illustrated in any of FIGS. 5B and 5C. The voltage Vind+DIM, which is the reference voltage VR, is inputted to a non-inverting input terminal (+) of an amplifier 51 of the FIG. 6A, and a sensing voltage VCS is inputted to an inverting input terminal (−) of the amplifier 51.

Figure 6B:
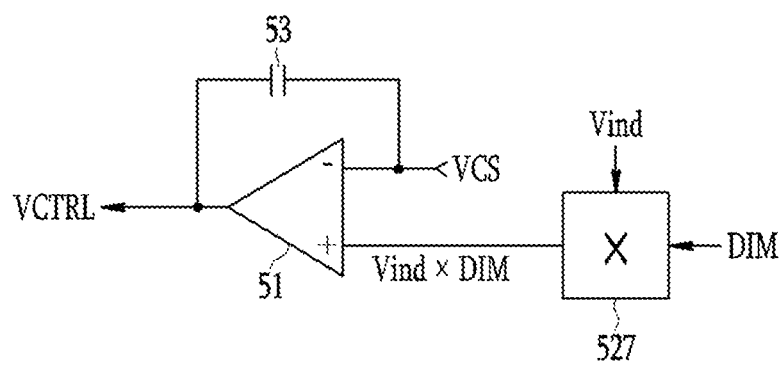
FIG. 6B illustrates a control signal generator using a reference voltage that is generated by multiplying an input detection voltage by a dimming signal, according to an embodiment.

FIG. 6B illustrates a control signal generator using a reference voltage VR that is generated by multiplying an input detection voltage Vind by a dimming signal DIM according to an embodiment.

Referring to FIG. 6B, the reference voltage VR is generated using a voltage Vind×DIM obtained by a multiplier 527, which multiplies the input detection voltage Vind by the dimming signal DIM. The voltage Vind×DIM, which is the reference voltage VR, is inputted to a non-inverting input terminal (+) of an amplifier 51 of the FIG. 6B, and a sensing voltage VCS is inputted to an inverting input terminal (−) of the amplifier 51.

In other embodiments, the control signal generator 5 of FIG. 1 may generate the control signal VCTRL based on a reference voltage VR, which corresponds to the input detection voltage Vind, and another voltage, which is generated by dividing the sensing voltage VCS by the dimming signal DIM or by subtracting the dimming signal DIM from the sensing voltage VCS. The other voltage may be referred to as a "comparative voltage." These embodiments will be described with reference to FIGS. 7A and 7B.

Figure 7A:
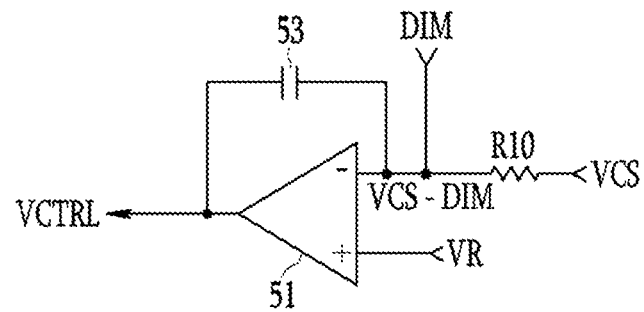
FIG. 7A illustrates a control signal generator using a voltage that is generated by subtracting a dimming signal from a detected voltage, according to an embodiment.

FIG. 7A illustrates a control signal generator using a voltage that is generated by subtracting a dimming signal DIM from a detected voltage, i.e., the sensing voltage VCS, according to an embodiment.

Referring to FIG. 7A, the dimming signal DIM is input to the inverting input terminal (−) of an amplifier 51, and a resistor R10 is connected between the inverting input terminal (−) of the amplifier 51 and a terminal carrying the sensing voltage VCS. Accordingly, a comparative voltage VCS-DIM, which is obtained by subtracting the dimming signal DIM from the sensing voltage VCS, is inputted to the inverting input terminal (−) of the amplifier 51. In an embodiment, the input detection voltage Vind may be inputted to a non-inverting input terminal (+) of the amplifier 51 of FIG. 7A as the reference voltage VR.

Figure 7B:
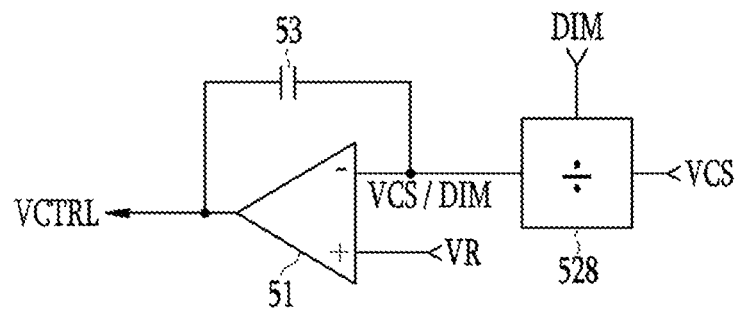
FIG. 7B illustrates a control signal generator using a voltage that is generated by dividing a detected voltage by a dimming signal, according to an embodiment.

FIG. 7B illustrates a control signal generator using a voltage that is generated by dividing a detected voltage VCS by a dimming signal DIM, according to an embodiment.

A divider 528 of FIG. 7B may apply, to an inverting input terminal (−) of an amplifier 51, a comparative voltage VCS/DIM that is obtained by dividing the sensing voltage VCS by the dimming signal DIM. In an embodiment, the input detection voltage Vind may be inputted to a non-inverting input terminal (+) of the amplifier 51 of FIG. 7B as the reference voltage VR.

Embodiments are not limited thereto. Accordingly, any embodiment may be provided, in which the IC scattering as well as the PF and THD are improved.

In other embodiments, the reference voltage generator 52 of FIG. 1 may generate the reference voltage VR using the input detection voltage Vind as well as the feedback voltage FB.

In some embodiments, the reference voltage generator 52 of FIG. 1 may generate the reference voltage VR by multiplying the input detection voltage Vind by the feedback voltage FB or by adding the input detection voltage Vind to the feedback voltage FB. These embodiments will be described with reference to FIGS. 8A and 8B.

Figure 8A:
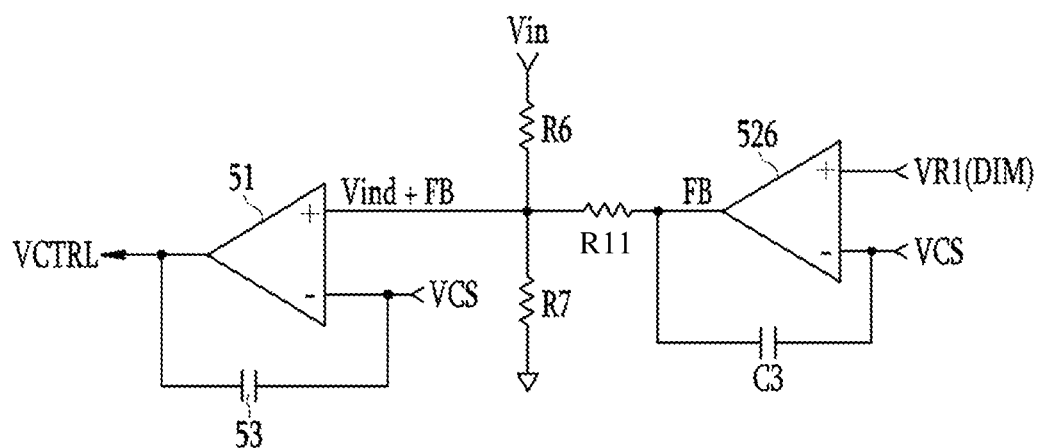
FIG. 8A illustrates a control signal generator using a reference voltage that is generated by adding a feedback voltage to an input detection voltage, according to an embodiment.

FIG. 8A illustrates a control signal generator using a reference voltage VR that is generated by adding a feedback voltage FB to an input detection voltage Vind, according to an embodiment.

Referring to FIG. 8A, a voltage Vind+FB, i.e., a sum of the input detection voltage Vind and the feedback voltage FB, is generated as the reference voltage VR, the input detection voltage Vind is divided from the input voltage Vin by the two resistors R6 and R7, and the feedback voltage FB is delivered to a non-inverting input terminal (+) of an amplifier 51 through a resistor R11. The voltage Vind+FB, which is the reference voltage VR, is inputted to the non-inverting input terminal (+) of the amplifier 51, and a sensing voltage VCS is inputted to an inverting input terminal (−) of the amplifier 51.

FIG. 8A illustrates a configuration for generating the input detection voltage Vind using the configuration illustrated in FIG. 5A. However, embodiments are not limited thereto. Accordingly, the configuration for generating the input detection voltage Vind may be implemented with the configuration illustrated in any of FIGS. 5B and 5C.

FIG. 8A illustrates that a feedback reference voltage VR1 is inputted to a non-inverting input terminal (+) of a feedback amplifier 526. In an embodiment, the dimming signal DIM may be inputted to the non-inverting input terminal (+) of the feedback amplifier 526 as the feedback reference voltage VR1.

Figure 8B:
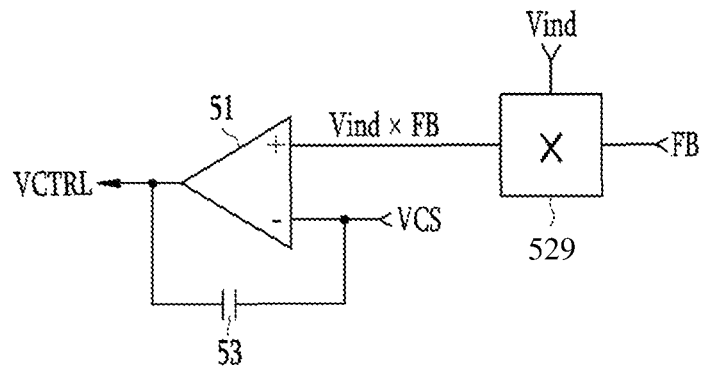
FIG. 8B illustrates a control signal generator using a reference voltage that is generated by multiplying an input detection voltage by a feedback voltage, according to an embodiment.

FIG. 8B illustrates a control signal generator using a reference voltage VR that is generated by multiplying an input detection voltage Vind by a feedback voltage FB, according to an embodiment. Referring to FIG. 8B, the reference voltage VR is generated from a voltage Vind×FB, which is obtained at a multiplier 529 that multiplies the input detection voltage Vind by the feedback voltage FB. The voltage Vind×FB, which is the reference voltage VR, is inputted to a non-inverting input terminal (+) of an amplifier 51 of FIG. 8B, and a sensing voltage VCS is inputted to an inverting input terminal (−) of the amplifier 51.

In other embodiments, the control signal generator 5 of FIG. 1 may generate the control signal VCTRL based on a reference voltage VR, which corresponds to the input detection voltage Vind, and another voltage, which is generated by dividing the sensing voltage VCS by the feedback voltage FB or by subtracting the feedback voltage FB from the sensing voltage VCS. The other voltage may be referred to as a "comparative voltage." These embodiments will be described with reference to FIGS. 9A and 9B.

Figure 9A:
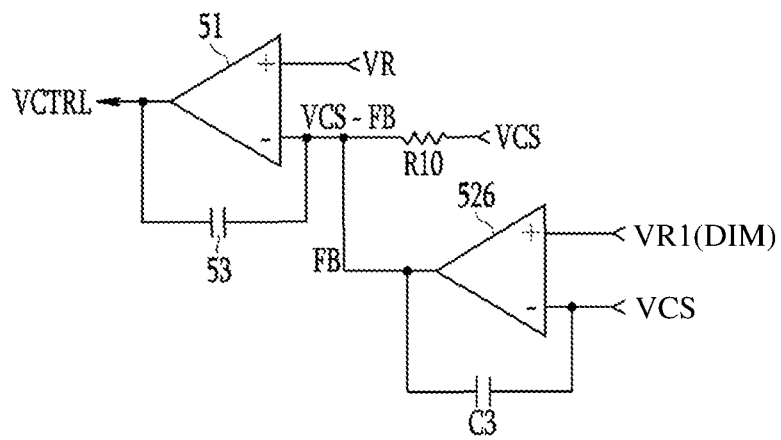
FIG. 9A illustrates a control signal generator using a voltage that is obtained by subtracting a feedback voltage from a detected voltage, according to an embodiment.

FIG. 9A illustrates a control signal generator using a voltage that is obtained by subtracting a feedback voltage FB from a detected voltage, i.e., the sensing voltage VCS, according to an embodiment.

Referring to FIG. 9A, the feedback voltage FB is inputted to an inverting input terminal (−) of an amplifier 51, and a resistor R10 is connected between the inverting input terminal (−) and a terminal carrying the sensing voltage VCS. Accordingly, a comparative voltage VCS-FB obtained by subtracting the feedback voltage FB from the sensing voltage VCS is inputted to the inverting input terminal (−) of the amplifier 51.

FIG. 9A illustrates that the feedback reference voltage VR1 is inputted to the non-inverting input terminal (+) of the feedback amplifier 526. In an embodiment, the dimming signal DIM may be inputted to the non-inverting input terminal (+) of the feedback amplifier 526 as the reference voltage VR1. In an embodiment, the input detection voltage Vind may be inputted to a non-inverting input terminal (+) of the amplifier 51 of FIG. 9A as the reference voltage VR.

Figure 9B:
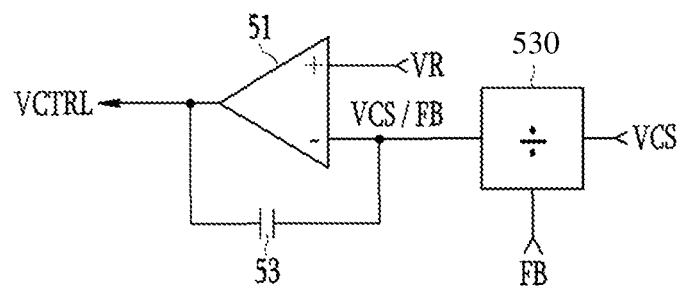
FIG. 9B illustrates a control signal generator using a voltage that is obtained by dividing a detected voltage by a feedback voltage, according to an embodiment.

FIG. 9B illustrates a control signal generator using a voltage that is generated by dividing a detected voltage VCS by a feedback voltage FB, according to an embodiment.

A divider 530 of FIG. 9B may apply, to an inverting input terminal (−) of an amplifier 51, a comparative voltage VCS/FB obtained by dividing the sensing voltage VCS by the feedback voltage FB. In an embodiment, the input detection voltage Vind may be inputted to a non-inverting input terminal (+) of the amplifier 51 of FIG. 9B as the reference voltage VR.

Using the input detection voltage Vind and the feedback voltage FB, which is a DC voltage, the average of the sensing voltages VCS can be regulated according to the feedback voltage FB. Accordingly, the method described above is applicable to current control.

The feedback voltage FB is one of examples of a DC voltage, and accordingly, any constant DC voltage may be used instead of the feedback voltage FB. For example, as shown in FIGS. 6A, 6B, 7A, and 7B, the dimming signal DIM may be used to generate the control signal VCTRL instead of the feedback voltage FB shown in FIGS. 8A, 8B, 9A, and 9B, respectively.

In an embodiment, a LED driving device includes a LED string comprising at least one LED element, at least one channel connected to the at least one LED element, a current regulator configured to regulate a current flowing through the at least one channel according to at least one corresponding control voltage, and a control signal generating circuit configured to generate a control signal based on a difference between a reference voltage and a comparative voltage, the comparative voltage being based on a sensing voltage, the sensing voltage corresponding to an LED current flowing through the LED string. The control signal generating circuit includes an amplifier configured to generate the control signal by amplifying a difference between the comparative voltage and the reference voltage.

In an embodiment, when the reference voltage is a DC voltage, a bandwidth of the amplifier is lower than a line frequency, an average of the sensing voltage being regulated to the DC voltage.

In an embodiment, when the reference voltage is a sinusoidal wave that follows an input voltage supplied to the LED string, a bandwidth of the amplifier is higher than a line frequency, the sensing voltage being regulated to follow the sinusoidal wave.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An LED driving device, comprising:
an LED string comprising at least first and second LED elements connected in series to each other;
first and second channels coupled to output nodes of the first and second LED elements, respectively;
first and second regulators configured to regulate a current flowing through the first and second channels in response to first and second control voltages, respectively;
a control voltage generating circuit configured to generate the first and second control voltages based on a difference between a reference voltage and a comparative voltage; and
a reference voltage generator configured to generate the reference voltage based on an input voltage and a dimming signal, the input voltage being supplied to the LED string, the dimming signal controlling dimming of the LED string,
wherein the comparative voltage is generated based on a sensing voltage, the sensing voltage corresponding to an LED current flowing through the LED string.

2. The LED driving device of claim 1, wherein the control voltage generating circuit comprises:
an amplifier configured to generate a control signal by amplifying the difference between the comparative voltage and the reference voltage; and
a control voltage generator configured to generate the first and second control voltages based on the control signal.

3. The LED driving device of claim 1, wherein the reference voltage generator generates an input detection voltage by detecting the input voltage, and generates the reference voltage based on the input detection voltage and the dimming signal, the dimming signal having a varying or constant value.

4. The LED driving device of claim 3, wherein the reference voltage generator generates the reference voltage by adding the input detection voltage to the dimming signal or by multiplying the input detection voltage by the dimming signal.

5. The LED driving device of claim 3, wherein the reference voltage generator generates a feedback voltage by amplifying and compensating a difference between the sensing voltage and the dimming signal, and generates the reference voltage by adding the input detection voltage to the feedback voltage or by multiplying the input detection voltage by the feedback voltage.

6. The LED driving device of claim 3, wherein the reference voltage generator generates the input detection voltage by dividing the input voltage using two resistors connected in series to each other.

7. The LED driving device of claim 3, wherein the reference voltage generator generates the input detection voltage by detecting a current flowing through a resistor, the input voltage being applied to the resistor.

8. The LED driving device of claim 3, wherein the reference voltage generator detects a point in time when the input voltage reaches zero, and generates the input detection voltage synchronized with the input voltage based on the detected point in time.

9. An LED driving device, comprising:
an LED string comprising at least first and second LED elements connected in series to each other;
first and second channels coupled to output nodes of the first and second LED elements, respectively;
first and second regulators configured to regulate a current flowing through the first and second channels in response to first and second control voltages, respectively; and
a control voltage generating circuit configured to generate the first and second control voltages based on a difference between a single reference voltage having a DC voltage and a comparative voltage, the comparative voltage being generated based on a sensing voltage and a dimming signal, the sensing voltage corresponding to an LED current flowing through the LED string, the dimming signal controlling diming of the LED string.

10. The LED driving device of claim 9, wherein the control voltage generating circuit comprises:
an amplifier configured to generate a control signal by amplifying the difference between the comparative voltage and the single reference voltage; and
a control voltage generator configured to generate the first and second control voltages based on the control signal.

11. The LED driving device of claim 10, wherein, when the single reference voltage has the DC voltage, an average of the sensing voltage is regulated to the DC voltage.

12. The LED driving device of claim 9, wherein the comparative voltage is obtained by subtracting the dimming signal from the sensing voltage or by dividing the sensing voltage by the dimming signal.

13. The LED driving device of claim 9, wherein the comparative voltage is obtained by subtracting a feedback voltage from the sensing voltage or by dividing the sensing voltage by the feedback voltage, wherein the feedback voltage is generated by amplifying and compensating a difference between the sensing voltage and the dimming signal.

14. The LED driving device of claim 9, wherein the DC voltage corresponds to a phase angle voltage, the phase angle voltage being determined to proportional to a phase angle of an input voltage, the input voltage being supplied to the LED string.

15. The LED driving device of claim 9, wherein the DC voltage corresponds to the dimming signal.

16. The LED driving device of claim 1, wherein the first and second control voltages have a same voltage level or different voltage levels.

17. The LED driving device of claim 1, wherein the comparative voltage is obtained by subtracting the dimming signal from the sensing voltage or by dividing the sensing voltage by the dimming signal.

18. The LED driving device of claim 1, wherein the comparative voltage is obtained by subtracting a feedback voltage from the sensing voltage or by dividing the sensing voltage by the feedback voltage, wherein the feedback voltage is generated by amplifying and compensating a difference between the sensing voltage and the dimming signal.

19. An LED driving device of claim 2, comprising:
an LED string comprising at least first and second LED elements connected in series to each other;
first and second channels coupled to output nodes of the first and second LED elements, respectively;
first and second regulators configured to regulate a current flowing through the first and second channels in response to first and second control voltages, respectively; and a control voltage generating circuit configured to generate the first and second control voltages based on a difference between a reference voltage and a comparative voltage, wherein the reference voltage is generated based on an input voltage, the input voltage being supplied to the LED string, wherein the comparative voltage is generated based on a sensing voltage, the sensing voltage corresponding to an LED current flowing through the LED string, and wherein the control voltage generating circuit comprises:
an amplifier configured to generate a control signal by amplifying the difference between the comparative voltage and the reference voltage; and
a control voltage generator configured to generate the first and second control voltages based on the control signal,
wherein, when the reference voltage has a sinusoidal wave that follows the input voltage, a bandwidth of the amplifier is higher than a line frequency, the sensing voltage being regulated to follow the sinusoidal wave.

20. The LED driving device of claim 1, wherein the dimming signal is generated based on a phase angle voltage, the phase angle voltage being determined to proportional to a phase angle of the input voltage.

* * * * *

UNITED STATES PATENT AND TRADEMARK OFFICE
CERTIFICATE OF CORRECTION

PATENT NO. : 10,530,259 B2
APPLICATION NO. : 15/994113
DATED : January 7, 2020
INVENTOR(S) : Hyun-Chul Eum, Doo-Yong Jung and Young-Jong Kim It is certified that error appears in the above-identified patent and that said Letters Patent is hereby corrected as shown below:

In the Claims

Column 12, Lines 30-46 please amend Claim 9 as follows:
9. An LED driving device, comprising: an LED string comprising at least first and second LED elements connected in series to each other; first and second channels coupled to output nodes of the first and second LED elements, respectively; first and second regulators configured to regulate a current flowing through the first and second channels in response to first and second control voltages, respectively; and a control voltage generating circuit configured to generate the first and second control voltages based on a difference between a single reference voltage having a DC voltage and a comparative voltage, the comparative voltage being generated based on a sensing voltage and a dimming signal, the sensing voltage corresponding to an LED current flowing through the LED string, the dimming signal controlling dimming of the LED string.

Column 13, Line 21 - Column 14, Line 23 please amend Claim 19 as follows:
19. An LED driving device comprising: an LED string comprising at least first and second LED elements connected in series to each other; first and second channels coupled to output nodes of the first and second LED elements, respectively; first and second regulators configured to regulate a current flowing through the first and second channels in response to first and second control voltages, respectively; and a control voltage generating circuit configured to generate the first and second control voltages based on a difference between a reference voltage and a comparative voltage, wherein the reference voltage is generated based on an input voltage, the input voltage being supplied to the LED string, wherein the comparative voltage is generated based on a sensing voltage, the sensing voltage corresponding to an LED current flowing through the LED string, and wherein the control voltage generating circuit comprises: an amplifier configured to generate a control signal by amplifying the difference between the comparative voltage and the reference voltage; and a control voltage generator configured to generate the first and second control voltages based on the control signal, wherein, when the reference voltage has a sinusoidal wave that follows the input voltage, a bandwidth of the amplifier is higher than a line frequency, the sensing voltage being regulated to follow the sinusoidal wave.

Signed and Sealed this
Eighteenth Day of February, 2020

Andrei Iancu
*Director of the United States Patent and Trademark Office*